United States Patent
Joshi et al.

(10) Patent No.: US 10,505,106 B1
(45) Date of Patent: Dec. 10, 2019

(54) ENCAPSULATED PCM SWITCHING DEVICES AND METHODS OF FORMING THE SAME

(71) Applicant: Toyota Motor Engineering & Manufacturing North America, Inc., Plano, TX (US)

(72) Inventors: Shailesh N. Joshi, Ann Arbor, MI (US); Naoya Take, Canton, MI (US)

(73) Assignee: TOYOTA MOTOR ENGINEERING & MANUFACTURING NORTH AMERICA, INC., Plano, TX (US)

( * ) Notice: Subject to any disclaimer, the term of this patent is extended or adjusted under 35 U.S.C. 154(b) by 0 days.

(21) Appl. No.: 16/164,181

(22) Filed: Oct. 18, 2018

(51) Int. Cl.
*H01L 47/00* (2006.01)
*H01L 45/00* (2006.01)

(52) U.S. Cl.
CPC .......... *H01L 45/06* (2013.01); *H01L 45/126* (2013.01); *H01L 45/1286* (2013.01); *H01L 45/14* (2013.01); *H01L 45/1616* (2013.01)

(58) Field of Classification Search
USPC ... 257/2–5, E31.029, E31.03, E21.487, 368, 257/536, 616, E21.004, E33.075, 257/E31.131, E23.051, E23.08–E23.113; 438/95, 96, 593, 783, 382, 102
See application file for complete search history.

(56) References Cited

U.S. PATENT DOCUMENTS

| | | | |
|---|---|---|---|
| 7,491,965 B2 | 2/2009 | Doyle et al. | |
| 7,642,538 B2 | 1/2010 | Fujita et al. | |
| 2007/0040159 A1* | 2/2007 | Wang | H01L 45/06 257/3 |
| 2007/0141786 A1* | 6/2007 | Kawagoe | H01L 27/2436 438/266 |
| 2011/0038093 A1 | 2/2011 | Furukawa et al. | |
| 2011/0049454 A1* | 3/2011 | Terao | H01L 27/2436 257/2 |
| 2011/0065252 A1* | 3/2011 | Nakamura | H01L 27/2436 438/382 |
| 2013/0001502 A1* | 1/2013 | Jung | H01L 45/06 257/4 |
| 2013/0134374 A1* | 5/2013 | Kim | H01L 45/00 257/2 |
| 2014/0266300 A1 | 9/2014 | Sherwin et al. | |
| 2014/0369113 A1* | 12/2014 | Krebs | G11C 13/0004 365/163 |

(Continued)

FOREIGN PATENT DOCUMENTS

CN  101833220 A   9/2010

OTHER PUBLICATIONS

Wang et al, "Development of a Phase Change Material (PCM)-Based Thermal Switch", Jul. 17, 2017. HKIE Transactions, 24(2) 107-112.

*Primary Examiner* — Niki H Nguyen
(74) *Attorney, Agent, or Firm* — Dinsmore & Shohl LLP

(57) ABSTRACT

Switches, breakers that incorporate a phase change material are disclosed, as well as electrical devices including the same. A switch includes a first conductor, a second conductor spaced a distance from the first conductor such that the second conductor does not contact the first conductor, and a switching device electrically coupled to the first conductor, the switching device having a phase change material that, when heated, expands to electrically contact the second conductor.

20 Claims, 5 Drawing Sheets

(56) References Cited

U.S. PATENT DOCUMENTS

2016/0079522 A1* 3/2016 Yamamoto .............. H01L 45/06
257/4
2017/0187347 A1 6/2017 Rinaldi et al.

* cited by examiner

ENCAPSULATED PCM SWITCHING DEVICES AND METHODS OF FORMING THE SAME

BACKGROUND

Field

The present specification generally relates to making and breaking electrical connections and, more particularly, to switches that utilize a phase change material (PCM) as a switching mechanism.

Technical Background

Electrical devices frequently utilize circuits for receiving electrical power from a power source. Such circuits may include switching devices, fuses, and/or the like that are used for making or breaking electrical connections.

In general, switching devices utilize mechanical components that are subject to wear and tear over time, which can cause malfunction if not replaced or repaired in a timely manner. Malfunction of the switching devices can cause damage to devices connected thereto, and when such devices are expensive and sophisticated electrical equipment, a large financial loss can occur. In addition, the downtime associated with replacing or repairing switches and/or replacing or repairing electrical components that have been damaged due to switch malfunction can be significant.

SUMMARY

In one embodiment, a switch includes a first conductor, a second conductor spaced a distance from the first conductor such that the second conductor does not contact the first conductor, and a switching device electrically coupled to the first conductor, the switching device having a phase change material that, when heated, expands to electrically contact the second conductor.

In another embodiment, a breaker includes a first conductor, a second conductor contacting the first conductor, and a switching device coupled to the first conductor, the switching device having a phase change material that, when heated, expands to move the first conductor out of contact with the second conductor.

In yet another embodiment, an electrical device includes a switch, a power source, and a power destination. The switch includes a first conductor, a second conductor spaced a distance from the first conductor such that the second conductor does not contact the first conductor, and a switching device electrically coupled to the first conductor, the switching device having a phase change material that, when heated, expands to electrically contact the second conductor. The power source is electrically coupled to the first conductor and configured to provide a current across the first conductor. The power destination is electrically coupled to the second conductor. Resistive properties of the first conductor produce heat that is absorbed by the phase change material.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DETAILED DESCRIPTION

The present disclosure relates generally to switches that use a phase change material (PCM) as a switching mechanism. The PCM is coated or encapsulated with a conductive barrier layer that contacts one or more electrodes in some embodiments. The PCM absorbs heat and expands to make or break an electrical connection and contracts when it cools to make or break an electrical connection. Because the PCM is not likely to degrade after successive heating and cooling cycles, it can be used for switching without concern for breakage of mechanical parts.

Figure 1A:
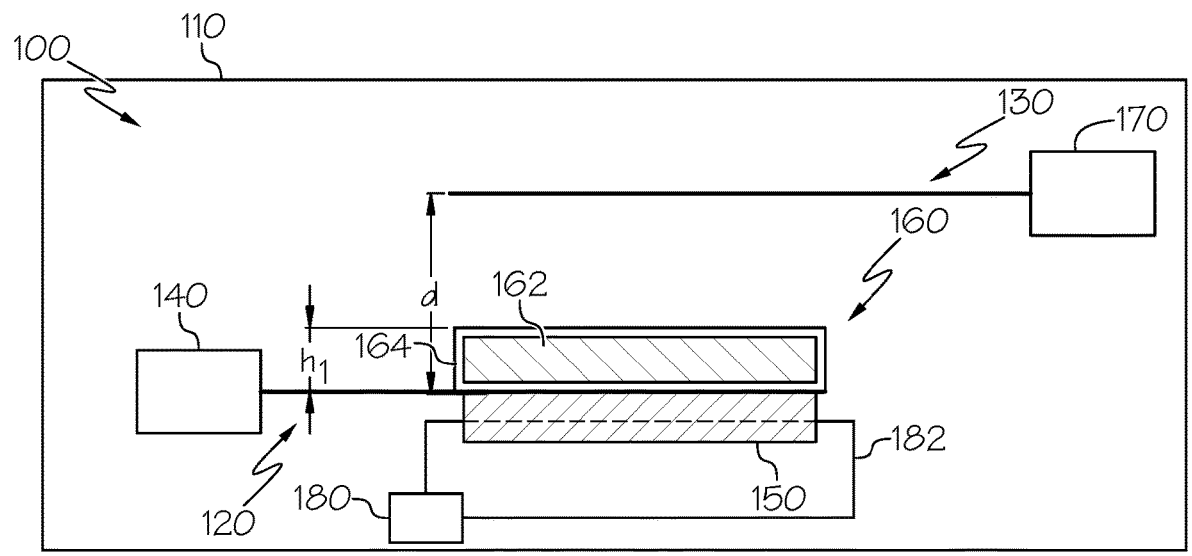
FIG. 1A schematically depicts an illustrative switch incorporating a PCM switching mechanism in an OFF state according to one or more embodiments shown and described herein.
Figure 1B:
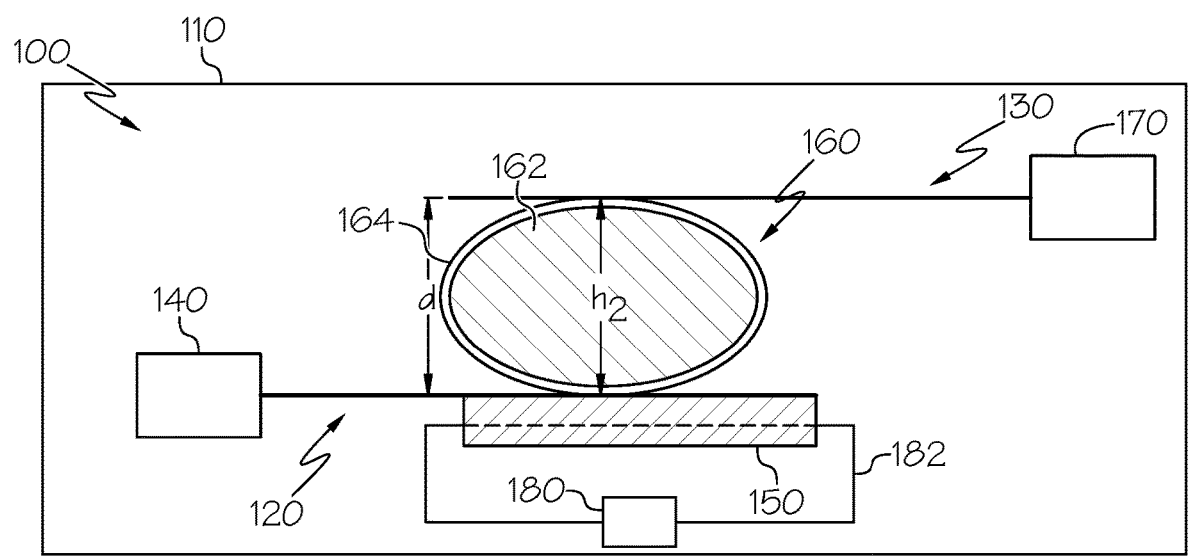
FIG. 1B schematically depicts the switch of FIG. 1A in an ON state according to one or more embodiments shown and described herein.

Referring now to the drawings, FIGS. 1A-1B depict an electrical device 110 having an illustrative switch, generally designated 100, within the electrical device 110 according to an embodiment. The electrical device 110 is generally not limited by the present disclosure, and can be any device that has components that require electricity to function. Illustrative examples of an electrical device 110 include, but are not limited to, large industrial equipment and components thereof, commercial electrical devices, residential electrical devices, electronic circuits, vehicles, vehicle components, and/or the like.

The switch 100 depicted in FIGS. 1A-1B generally selectively supplies electrical power to a device or component within the electrical device 110. That is, the switch 100 can be in a first configuration (e.g., an "OFF" state as depicted in FIG. 1A whereby electrical power is not supplied to a device or component of the electrical device 110) or in a second configuration (e.g., an "ON" state as depicted in FIG. 1B whereby power is supplied to a device or component of the electrical device 110). However, it should be understood that the switch 100 may also be adapted to supply electrical power in other ways, such as configurations whereby electrical power is switched between a plurality of devices (e.g., configured to supply electrical power to a first device or a second device based on the orientation of the switch 100 and components thereof to the first device and the second device). The switch 100 can generally be configured for any type of switching application, and is not limited to a particular application. For example, the switch 100 may be used in for large industrial equipment, commercial applications, residential applications, electronic circuit applications, vehicles, vehicle components, and/or the like.

Still referring to FIGS. 1A-1B, the switch 100 generally includes a first conductor 120, a second conductor 130, a support structure 150, and a switching device 160. The first conductor 120 is spaced apart from the second conductor 130 such that the first conductor 120 does not physically contact the second conductor 130. That is, the first conductor 120 is spaced a distance d from the second conductor 130. The distance d between the first conductor 120 and the second conductor 130 is not limited by the present disclosure, and may generally be any distance, particularly distances that are generally recognized and understood for particular switch applications, arrangement of components, amount and composition of materials that are used within the switching device 160 (as described hereinbelow), distances that avoid arcing, and/or the like. For example, the distance d between the first conductor 120 and the second conductor 130 can be on the micrometer level (e.g., about 1 µm to about 999 µm), the millimeter level (e.g., about 1 mm to about 9 mm), the centimeter level (e.g., about 1 cm to about 99 cm), the meter level (e.g., about 1 meter or greater), and/or the like.

The switching device 160 is generally arranged between the first conductor 120 and the second conductor 130 to make or break an electrical connection between the first conductor 120 and the second conductor 130, as described in greater detail herein. That is, the switching device 160 is positioned such that the switching device 160 contacts the first conductor 120 and/or the second conductor 130 in the space between the first conductor 120 and the second conductor 130.

The electrical device 110 may further include a power source 140 and a power destination 170. To provide electrical power to the power destination 170 from the power source 140, the switch 100 may generally be positioned between the power source 140 and the power destination 170. More specifically, the first conductor 120 of the switch 100 is generally electrically coupled to a power source 140. That is, the first conductor 120 may be physically coupled to an electric terminal or the like of the power source 140 to receive an electrical current from the power source 140. In addition, the second conductor 130 of the switch 100 is generally electrically coupled to a power destination 170. That is, the second conductor 130 may be physically coupled to an electric terminal or the like of the power destination 170 to transmit an electrical current to the power destination 170 when electrical current is supplied through the second conductor 130.

The support structure 150 may generally provide support for the switching device 160 to ensure that the switching device 160 expands in correct direction when transitioning the switch 100 from an "OFF" state to an "ON" state, as described in greater detail herein. In addition, the support structure 150 may also include a heating element the heats the switching device 160, as described in greater detail herein. That is, in some embodiments, a heating electrode 182 coupled to a second power source 180 may be embedded within (or otherwise attached to) the support structure 150 and electrically isolated from the first conductor 120 in some embodiments. It should be understood that the second power source 180 and the heating electrode 182 are merely one illustrative example of a heating element that may be used to heat the switching device 160. That is, other heating elements that heat the switching device 160 may also be used without departing from the scope of the present disclosure.

In some embodiments, the support structure 150 may be a component of the switch 100 (e.g., integrated with or coupled to the switch 100). The support structure 150 may be arranged adjacent to the switching device 160 such that a surface of the support structure 150 supports at least a portion of the switching device 160 thereon and such that the heating element embedded within or coupled to the support structure 150 heats the switching device 160. In some embodiments, the support structure 150 and the switching device 160 may be arranged such that the first conductor 120 and/or the heating electrode 182 are positioned therebetween. That is, the first conductor 120 and/or the heating electrode 182 may be coupled to or integrated with a surface of the support structure 150, and the switching device 160 may be coupled to the first conductor 120 and/or the heating electrode 182 accordingly. In some embodiments, the heating electrode 182 may be a portion of the support structure 150 such that the support structure 150 is electrically coupled to the second power source 180 and the switching device 160 such that electrical current delivered via the heating electrode 182 heats the support structure 150 accordingly.

The support structure 150 may be a substrate or the like that has at least one surface positioned adjacent to the switching device 160 and arranged to direct the switching device 160 to expand towards the second conductor 130 when the phase change material is heated, as described herein. In some embodiments, the support structure 150 may be constructed of an insulator material that is used to ensure heat flux is directed toward the switching device 160. In some embodiments, the support structure 150 may be used to selectively draw heat flux out of the phase change material of the switching device 160 to cause the phase change material to change phase and contract, as described herein While the support structure 150 depicted in FIGS. 1A-1B is generally planar, this is merely illustrative. That is, the support structure 150 may be shaped and/or arranged in other configurations that direct expansion of the switching device 160 towards the second conductor 130 when the phase change material is heated. For example, the support structure 150 may be shaped and/or arranged to substantially surround the switching device 160 on all but one side (e.g., having one open end) such that the phase change material, when heated, can only expand out of the open end of the support structure 150 towards the second conductor 130.

The support structure 150 may be a substrate or the like that has at least one surface positioned adjacent to the switching device 160 and arranged to direct the switching device 160 to expand towards the second conductor 130 when the phase change material is heated, as described herein. In some embodiments, the support structure 150 may be constructed of an insulator material that is used to ensure heat flux is directed toward the switching device 160. In some embodiments, the support structure 150 may be used to selectively draw heat flux out of the phase change material of the switching device 160 to cause the phase change material to change phase and contract, as described herein While the support structure 150 depicted in FIGS. 1A-1B is generally planar, this is merely illustrative. That is, the support structure 150 may be shaped and/or arranged in other configurations that direct expansion of the switching device 160 towards the second conductor 130 when the phase change material is heated. For example, the support structure 150 may be shaped and/or arranged to substantially surround the switching device 160 on all but one side (e.g., having one open end) such that the phase change material, when heated, can only expand out of the open end of the support structure 150 towards the second conductor 130.

The heating electrode 182 may generally be any length of conductive material that is typically used for conducting electricity and generating heat as a byproduct of the resistivity of the heating electrode 182. In some embodiments, the material and dimensions of the heating electrode 182 may be selected such that the heating electrode 182 generates a particular amount of heat when a particular current is passed through the conductor. That is, the material and the dimensions of the heating electrode 182 may be selected such that the heat generated by the heating electrode 182 as a result of the current (e.g., the resistivity of the material) is sufficient to cause a particular phase change material to change in phase to electrically connect the first conductor 120 to the second conductor 130 above the threshold and disconnect the first conductor 120 from the second conductor 130 below the threshold, as described in greater detail herein. Particular materials and dimensional aspects that generate a particular amount of heat when a particular current is passed therethrough are generally understood and are not described in greater detail herein. Illustrative examples of materials that may be used for the heating electrode 182 include, but are not limited to, copper, silver, aluminum, gold, zinc, nickel, iron, platinum, compounds containing one or more of the foregoing, alloys of one or more of the foregoing, and/or the like. Accordingly, when power is supplied to the heating electrode 182 via the second power source 180, the resistivity of the heating electrode 182 may cause the heating electrode 182 to increase in temperature, thereby resulting in an increase in temperature of the switching device 160, as described herein.

The first conductor 120 and the second conductor 130 may each generally be any length of conductive material that is typically used for conducting electricity. In some embodiments, the material and dimensions of the first conductor 120 and the second conductor 130 may be selected such that the first conductor 120 and/or the second conductor 130 can support a particular current that is passed through the conductor. That is, if the switch 100 is to be designed to effect switching at a threshold current of 100 amps, the material and the dimensions of the first conductor 120 and the second conductor 130 may be selected such that damage does not occur to the first conductor 120 and/or the second conductor 130 (or surrounding materials). Particular materials and dimensional aspects that generate a particular amount of heat when a particular current is passed therethrough are generally understood and are not described in greater detail herein. Illustrative examples of materials that may be used for the first conductor 120 and/or the second conductor 130 include, but are not limited to, copper, silver, aluminum, gold, zinc, nickel, iron, platinum, compounds containing one or more of the foregoing, alloys of one or more of the foregoing, and/or the like.

The switching device 160 may generally have a core 162 coated with, encapsulated by, or otherwise covered by a shell 164. For example, the shell 164 may be formed on the core 162 via a deposition method such as atomic layer deposition (ALD), as described in greater detail herein. Accordingly, the shell 164 completely surrounds the core 162 and acts as a barrier between the core 162 and the various other components of the switch 100, including the first conductor 120, the second conductor 130, and the support structure 150. As described in further detail hereinbelow, the specific properties of the switching device 160 and the components thereof allow the switching device 160 to change in size from a first configuration to a second configuration (e.g., from a first switched position to a second switched position). The embodiment depicted in FIGS. 1A and 1B shows the switching device 160 having two configurations: FIG. 1A depicts a first configuration whereby the switching device 160 has an average first height $h_1$ (e.g., a contracted height) and FIG. 1B depicts a second configuration whereby the switching device 160 has an average second height $h_2$ (e.g., an expanded height). The average first height $h_1$ of the switching device 160 is generally less than the average second height $h_2$. In addition, the average second height $h_2$ is substantially the same as the distance d between the first conductor 120 and the second conductor 130. Accordingly, when the switching device 160 is in the first configuration at the average first height $h_1$, the switching device 160 only contacts one of the first conductor 120 and the second conductor 130 (depicted in FIG. 1A as contacting only the first conductor 120). When the switching device 160 is in the second configuration at the average second height $h_2$, the switching device 160 contacts both the first conductor 120 and the second conductor 130.

The core 162 is generally a phase change material that, when heated, changes from a first phase (e.g., a solid phase) to a second phase (e.g., a liquid phase, a second solid phase, etc.). For example, the phase change material may change from a liquid phase to a solid phase, from a first solid phase to a second solid phase, and/or the like. In addition, the change from the first phase to the second phase causes the phase change material to expand due to the coefficient of thermal expansion and/or the volume change between phases. When reversed (e.g., when cooled), the phase change material reverts back to the first phase from the second phase. That is, the phase change material may change from a liquid phase to a solid phase, from a second solid phase to a first solid phase, and/or the like upon cooling. As a result, the core 162 at a relative lower temperature may resemble a smaller shape and size (e.g., such that the switching device 160 has the average first height $h_1$ and is not contacting both the first conductor 120 and the second conductor 130) as shown in FIG. 1A. In addition, the core 162 at a relative higher temperature may resemble a larger shape and size (e.g., such that the switching device 160 has the average second height $h_2$ and is contacting both the first conductor 120 and the second conductor 130) as shown in FIG. 1B.

Still referring to FIGS. 1A-1B, the phase change material of the core 162 may be a solid-solid phase transition material, a gas-solid phase transition material (particularly any gaseous materials that can be contained within the shell 164 without escaping), or a solid-liquid phase transition material. Examples of solid-solid phase transition materials include, but are not limited to, high density polyethylene (HDPE), a metal organic compound with a layered perovskite crystal structure, a polyol, and the like. Examples of solid-liquid phase transition materials include, but are not limited to, a hydrated salt, wax, a metal alloy, and the like. In some embodiments, the phase change material may be such that phase change occurs in direct relation to the amount of current passed through the heating electrode 182, the material used for the heating electrode 182, and/or the dimensional characteristics of the heating electrode 182 as described in greater detail herein. For example, the phase change material may be a low temperature PCM such as a water based gel; a medium temperature PCM such as hydrated salt, an organic compound, and a polymer material; or a high temperature PCM such as molten salt and a metal alloy. In some embodiments, the phase change material may be selected based on whether it contains certain organic components, inorganic components, or a mixture of organic and inorganic components. Illustrative examples of organic phase change materials include, but are not limited to, carboxylic acid, esters, and polyols. Illustrative examples of inorganic phase change materials include, but are not limited to, a crystal hydrated salt, a molten salt, a metal alloy, and the like. Illustrative examples of mixtures include organic and inorganic eutectic mixtures. In some embodiments, the core 162 may be formed from a solder compound. In particular embodiments, the core 162 may be formed from tin, an alloy containing tin, a compound containing tin, or the like. In other particular embodiments, the core 162 may be formed from indium, an indium alloy, a compound containing indium, or the like.

It should be understood that the phase change material used in the core 162 may generally be selected based on one or more factors. Illustrative factors include phase change temperature, the phase change latent heat, amount of expansion of the phase change material, the reversibility of the phase change material, toxicity, corrosivity, and resulting chemical reactions of the phase change material, price and availability of the phase change material, electrical conductivity of the phase change material, and/or the like. That is, in some embodiments, the phase change material may be selected based the temperature at which phase change occurs, which may correspond to a threshold temperature at which the heating electrode 182 and/or the support structure 150 heats upon application of a particular current. For example, if it is desired that the switch 100 switches from an "OFF" state to upon application of a particular threshold current on the heating electrode 182, the PCM selected for the core 162 should have a phase change temperature (e.g., a melting point) that is generally equivalent to the temperature of the heating electrode 182 when the threshold current is applied across the heating electrode 182. More specifically, if a 12 AWG copper wire is used for the heating electrode 182 and it is desired to ensure that the switching does not occur until the current flowing through the copper wire reaches a threshold amperage that causes the copper wire to heat to about 114° C. due to the resistivity of the copper wire, then the PCM that is selected should have a phase change temperature (e.g., melting point) of about 156° C. (e.g., an Indium phase change material). In other embodiments, the phase change material may be selected based on an amount of expansion of the phase change material. For example, if the distance d between the first conductor 120 and the second conductor 130 is about 1 millimeter (mm) apart, the amount and composition of phase change material may be selected such that in a first state, at least one dimensional aspect of the phase change material is less than 1 mm and in a second state, the at least one dimensional aspect of the phase change material is about 1 mm without expanding substantially greater than 1 mm (to avoid damage) and without expanding substantially less than 1 mm (to ensure contact with both the first conductor 120 and the second conductor 130).

The shell 164 that coats, encapsulates, or otherwise covers the core 162 may generally be a thin film of material. The thin film generally has an average thickness on the nanometer scale. That is, the shell 164 has a thickness from about 1 nm to about 1000 nm (1 μm). The shell 164 generally covers an entire surface area of the core 162 such that the core 162 is not exposed to other components of the switch 100. In addition, covering the entire surface area of the core 162 with the shell 164 ensures that the shell 164 physically contacts the first conductor 120 and the second conductor 130 when the switching device 160 is in the second configuration depicted in FIG. 1B and provides an unbroken electrical path for current to flow from the first conductor 120 to the second conductor 130 (either alone or in conjunction with the core 162).

The shell 164 may generally be an electrically conductive material that is malleable or otherwise able to flex and contract as a result of the expansion and contraction of the phase change material in the core 162. That is, the shell 164 may generally be made of a material that does not crack, break, or otherwise become damaged as a result of the expansion and contraction of the phase change material in the core 162 so as to ensure that the unbroken electrical path for current to flow from the first conductor 120 to the second conductor 130 via the shell 164 is maintained. In some embodiments, the shell 164 may be formed from platinum, a platinum mixture, a compound containing platinum, an alloy containing platinum, and/or the like. In some embodiments, the shell 164 may be formed from aluminum, copper, aluminum oxides, silicon, mixtures containing one or more of the foregoing, compounds containing one or more of the foregoing, alloys containing one or more the foregoing, or the like.

The power source 140 is not limited by this disclosure, and may generally be any component that generates and/or supplies electrical power. For example, the power source 140 may be a battery, a fuel cell, a generator, an alternator, a solar power converter, a capacitor, a connection to an electrical grid (e.g., a power outlet), or the like.

The power destination 170 is likewise not limited by this disclosure, and may generally be any component or collection of components that receives electrical power and/or uses electrical power to function. In some embodiments, the power destination 170 may any power electronics device in a vehicle or vehicle component. For example, the power destination 170 may be one or more components in an infotainment system of a vehicle, one or more components of a vehicle information display, one or more components of a vehicle navigation system, one or more components of a vehicle electronic control unit, one or more components of a combination meter, one or more autonomous or semiautonomous vehicle components, one or more vehicle drive components, one or more vehicle steering components, and/or the like. Other electric or electronic components that may be the power destination 170 should generally be understood. In some embodiments, the power destination 170 may be a collection of components, such as a circuit containing a plurality of electrically coupled components.

In embodiments where the switch 100 is in an "OFF" state, the switching device 160 may physically contact one of the first conductor 120 and the second conductor 130 (as particularly shown in FIG. 1A) or may not physically contact either of the first conductor 120 or the second conductor 130. In embodiments where the switch 100 is in an "ON" state, the switching device 160 may physically contact both the first conductor 120 and the second conductor 130 (as particularly shown in FIG. 1B).

In operation, the second power source 180 may provide a particular current across the heating electrode 182, which causes the heating electrode 182 to heat to a corresponding particular threshold temperature (e.g., increase in temperature due to the electrical resistance of the material of the heating electrode 182). Once the heating electrode 182 heats to the particular corresponding threshold temperature (as predetermined based on the type of material used in the switching device 160 and the characteristics of the heating electrode 182), the phase change material in the switching device 160 changes phase and expands due to the coefficient of thermal expansion and/or volume change, causing the switching device 160 to transition from the average first height $h_1$ to the average second height $h_2$. As a result, the shell 164 of the switching device 160 contacts both the first conductor 120 and the second conductor 130, thereby creating an electrical connection between the first conductor 120 and the second conductor 130 such that a current passed through the first conductor 120 from the power source 140 continues on through the shell 164 (and/or the core 162) and the second conductor 130 to the power destination 170 (as particularly shown in FIG. 1B).

In a reverse operation, electrical power to the power destination 170 may be terminated (e.g., cut off) by reducing the current supplied from the second power source 180 such that the heating electrode 182 cools (e.g., decreases in temperature as the heat dissipates into a surrounding environment and/or is received by one or more of the components described herein), which causes the phase change material to change phase back to the original phase and contract, thereby transitioning from the average second height $h_2$ to the average first height $h_1$ (as particularly depicted in FIG. 1A). As a result, the shell 164 no longer contacts both the first conductor 120 and the second conductor 130 (e.g., the shell 164 only contacts the first conductor 120), thereby terminating the electrical current supplied to the power destination 170.

Figure 2A:
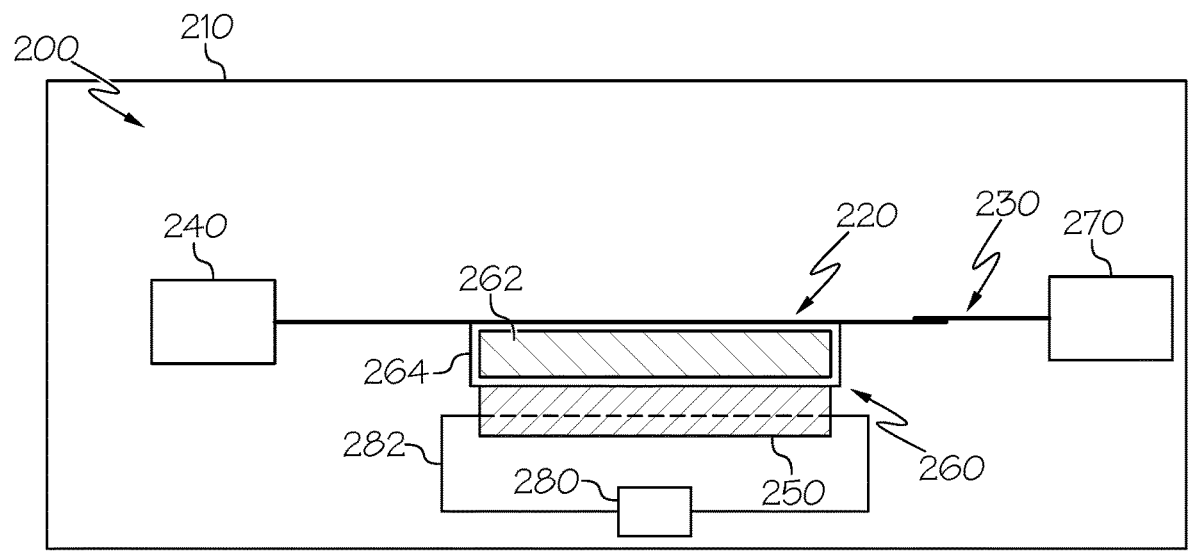
FIG. 2A schematically depicts an illustrative breaker incorporating a PCM switching mechanism in a connected state according to one or more embodiments shown and described herein.
Figure 2B:
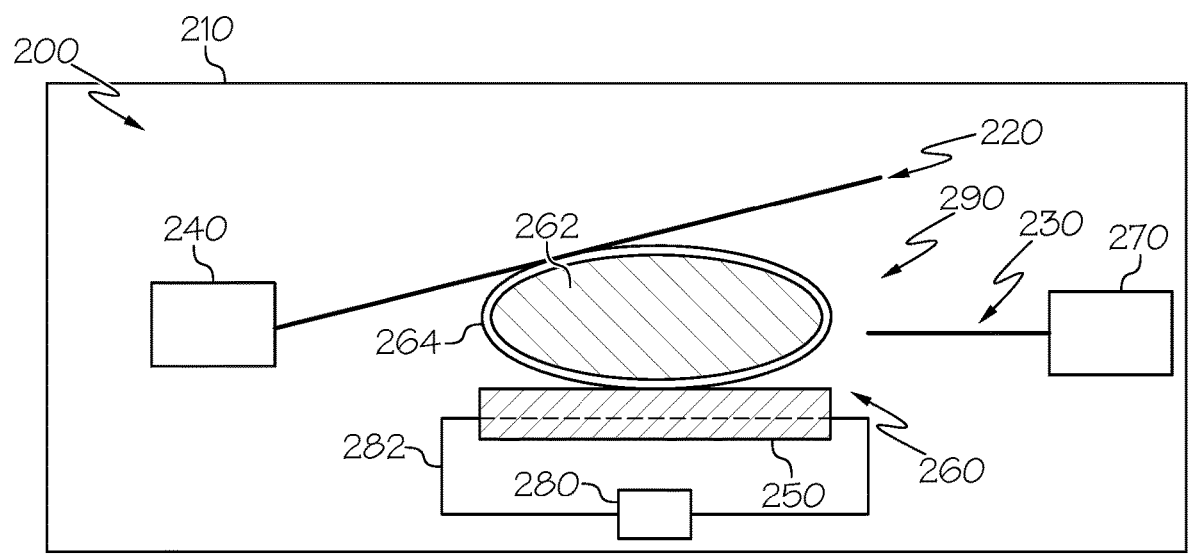
FIG. 2B schematically depicts the breaker of FIG. 2A in a disconnected state according to one or more embodiments shown and described herein.

FIGS. 2A and 2B depict another switch 200 within an electrical device 210 according to another embodiment. The switch 200 depicted in FIGS. 2A-2B generally selectively terminates electrical power to a device. That is, the switch 200 can be in a first configuration (e.g., in an "ON" state as depicted in FIG. 2A whereby electrical power is supplied to a device) or in a second configuration (e.g., an "OFF" state as depicted in FIG. 2B whereby power is not supplied to a device). However, it should be understood that the switch 200 may also be adapted to supply electrical power in other ways based on the orientation of the switch 200 and components thereof relative to other components. The switch 200 can generally be configured for any type of switching application, and is not limited to a particular application. For example, the switch 200 may be used in for large industrial equipment, commercial applications, residential applications, electronic circuit applications, vehicles, vehicle components, and/or the like.

Still referring to FIGS. 2A-2B, the switch 200 generally includes a first conductor 220, a second conductor 230, a support structure 250, and a switching device 260. In an initial configuration, the first conductor 220 is generally positioned adjacent to and contacting the second conductor 230. In addition, the first conductor 220 is movable away from the second conductor 230 such that the first conductor 220 and the second conductor 230 do not contact one another in another configuration, as described in greater detail hereinbelow. The switching device 260 is generally arranged adjacent to and contacting the first conductor 220 and positioned to make or break an electrical connection between the first conductor 220 and the second conductor 230, as described in greater detail herein.

The electrical device 210 may further include a power source 240 and a power destination 270. To provide electrical power to the power destination 270 from the power source 240, the switch 200 may generally be positioned between the power source 240 and the power destination 270. More specifically, the first conductor 220 of the switch 200 is generally electrically coupled to a power source 240. That is, the first conductor 220 may be physically coupled to an electric terminal or the like of the power source 240 to receive an electrical current from the power source 240. In addition, the second conductor 230 of the switch 200 is generally electrically coupled to a power destination 270. That is, the second conductor 230 may be physically coupled to an electric terminal or the like of the power destination 270 to transmit an electrical current to the power destination 270 when electrical current is supplied through the second conductor 230. It should be understood that the connections mentioned above are merely illustrative, and other configurations are also contemplated. For example, the first conductor 220 may be electrically coupled to the power destination 270 and the second conductor 230 may be electrically coupled to the power source 240 in some embodiments.

The support structure 250 generally provides support for the switching device 260 to ensure that the switching device 260 expands in correct direction when transitioning the switch 200 from an "ON" state to an "OFF" state, as described in greater detail herein. As such, the support structure 250 may be arranged adjacent to the switching device 260 such that a surface of the support structure 250 supports at least a portion of the switching device 260 thereon. In some embodiments, the support structure 250 may be arranged as part of the switch 200 (e.g., integrated with or coupled to the switching device 260). In some embodiments, the support structure 250 may generally be similar to the support structure 150 described herein with respect to FIGS. 1A-1B. Accordingly, for the purposes of brevity, additional details regarding the support structure 250 are not further described herein.

Still referring to FIGS. 2A-2B, a heating element may be contained within the support structure 250 and/or located on a surface of the support structure 250 such that the heating element can selectively heat the switching device 260, as described herein. In the embodiment of FIGS. 2A-2B, the heating element may be a heating electrode 282 embedded within or coupled to the support structure 250, electrically isolated from the first conductor 220 and the second conductor 230, and electrically coupled to a second power source 280 that supplies electrical power to heat the heating electrode 282. In some embodiments, the second power source 280 and the heating electrode 282 may generally be similar to the second power source 180 and the heating electrode 282 described herein with respect to FIGS. 1A-1B. Accordingly, for the purposes of brevity, additional details regarding the second power source 280 and the heating electrode 282 are not further described herein. It should be understood that other heating elements may be used without departing from the scope of the present disclosure.

Still referring to FIGS. 2A-2B, the first conductor 220 and the second conductor 230 may generally be similar to the first conductor 120 and the second conductor 130 described herein with respect to FIGS. 1A-1B. That is, the first conductor 220 and the second conductor 230 may each be constructed of the same materials and shaped, sized, and configured in a manner similar to that of the first conductor 120 and the second conductor 130 described herein with respect to FIGS. 1A-1B. As such, for the purposes of brevity, additional details regarding the first conductor 220 and the second conductor 230 are not further described herein.

Still referring to FIGS. 2A-2B, the switching device 260 may generally have a core 262 coated with, encapsulated by, or otherwise covered by a shell 264. The switching device 260, including the core 262 and the shell 264 thereof, are similar to the switching device 160, the core 162, and the shell 164 described herein with respect to FIGS. 1A-1B. That is, the switching device 260, the core 262, and the shell 264 may each be constructed of the same materials and configured in a manner similar to that of the switching device 160, the core 162, and the shell 164 described herein with respect to FIGS. 1A-1B. Accordingly, for the purposes of brevity, additional details regarding the switching device 260, the core 262, and the shell 264 are not further described herein.

Still referring to FIGS. 2A-2B, the power source 240 and the power destination 270 may generally be similar to the power source 140 and the power destination 170 described herein with respect to FIGS. 1A-1B. That is, the power source 240 and the power destination 270 may each be configured in a manner similar to that of the power source 140 and the power destination 170 described herein with respect to FIGS. 1A-1B. As such, for the purposes of brevity, additional details regarding the power source 240 and the power destination 270 are not further described herein.

In operation, the second power source 280 may supply a particular current across the heating electrode 282, which causes the heating electrode 282 to heat (e.g., increase in temperature due to the electrical resistance of the material of the heating electrode 282). Since the first conductor 220 and the second conductor 230 are contacting one another in an initial state, the current passes through the first conductor 220 to the second conductor 230 to the power destination 270. If a particular amount of current from the second power source 280 causes the heating electrode 282 to heat above a particular threshold temperature (as predetermined based on the type of material used in the switching device 260 and the characteristics of the heating electrode 282), the phase change material in the switching device 260 changes phase and expands due to the coefficient of thermal expansion and/or the volume change between phases, causing the switching device 260 to transition from a first state to a second state, as described herein with respect to FIGS. 1A-1B. Still referring to FIGS. 2A-2B, the expanding volume of the switching device 260 applies a pressure on the first conductor 220, thereby causing the first conductor 220 to move out of contact with the second conductor 230, terminating an electrical supply to the power destination 270 (as particularly depicted in FIG. 2B). As such, the switch 200 acts as a breaker to cut power to the power destination 270 in some embodiments. Accordingly a space 290 exists between the first conductor 220 and the second conductor 230.

It should be understood that while the switch 200 depicted in FIGS. 2A-2B is generally a breaker that is reversible (i.e., the current from the power source 240 can be lowered or terminated to decrease the temperature and cause the phase change material to phase change and contract), the present disclosure is not limited to such. That is, in some embodiments, the switch 200 may be configured as a fuse whereby the phase change material does not contract when the temperature is reduced (e.g., the fuse "blows"). As such, the switch 200 must be repaired or replaced after such an event occurring.

In a reverse operation, electrical power supplied by the second power source 280 may be reduced, such as by reducing the current beneath the threshold so that the heating electrode 282 cools (e.g., decreases in temperature as the heat dissipates into a surrounding environment and/or is received by one or more components described herein), which causes the phase change material to change phase again back to the original phase and contract, thereby transitioning from the second state back to the first state (as particularly depicted in FIG. 2A). As a result, the first conductor 220 is brought back into contact with the second conductor 230 so that the current can flow from the power source 240 to the power destination 270.

Figure 3:
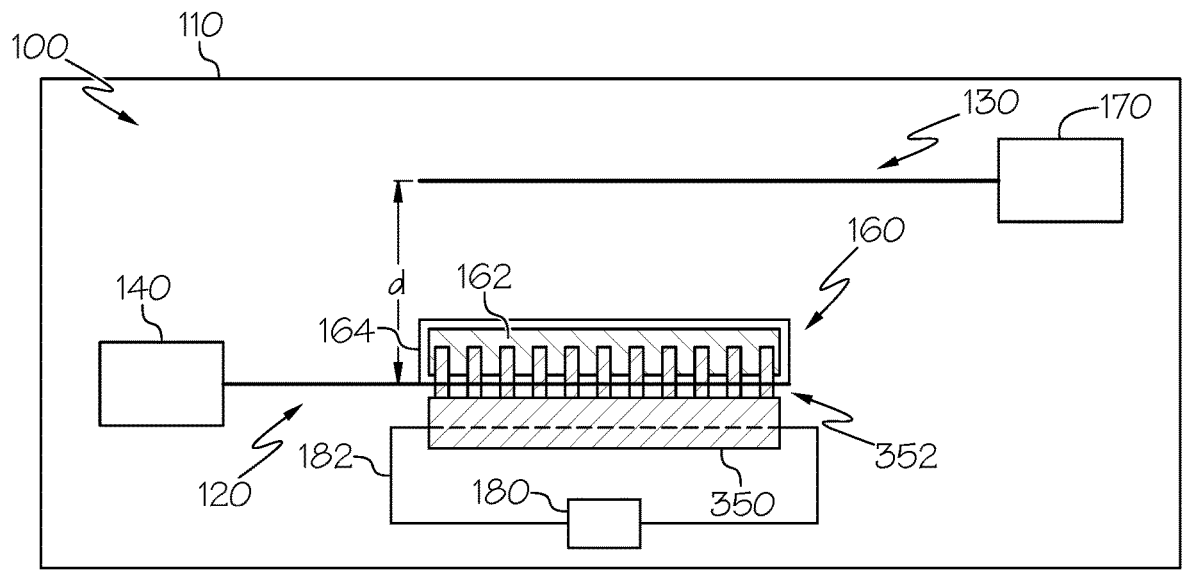
FIG. 3 schematically depicts an illustrative switch thermally coupled to a heat sink according to one or more embodiments shown and described herein.
Figure 4:
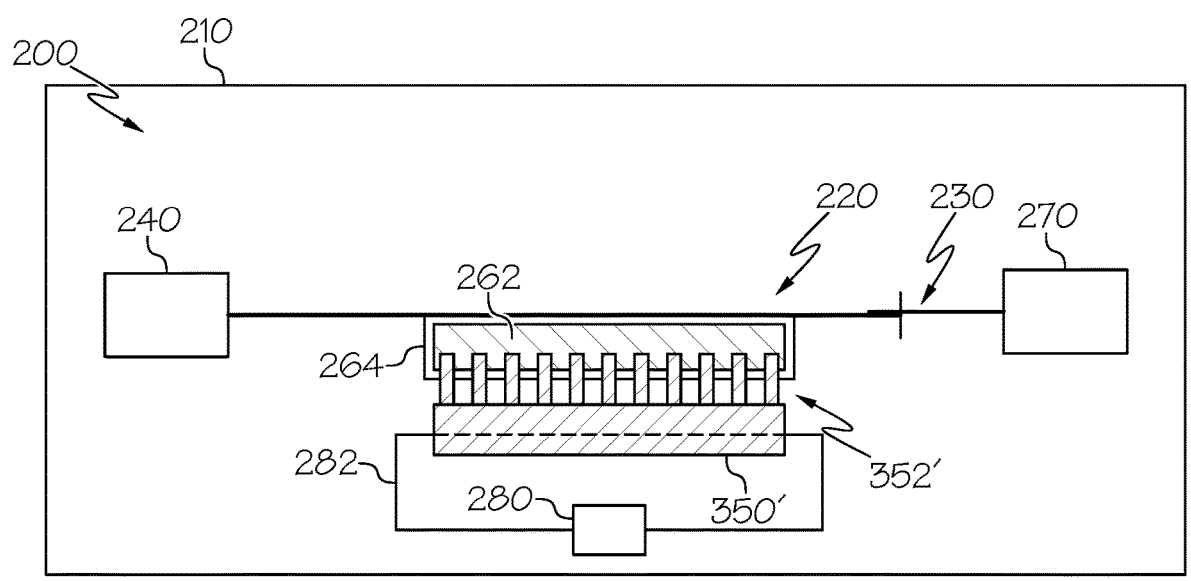
FIG. 4 schematically depicts an illustrative breaker thermally coupled to a heat sink according to one or more embodiments shown and described herein.

In some embodiments, the electrical device 110 of FIGS. 1A-1B may further include a heat sink 350, and the switch 100 of FIGS. 1A-1B may further be coupled to the heat sink 350, as depicted in in FIG. 3. Similarly, in some embodiments, the electrical device 210 of FIGS. 2A-2B may further include a heat sink 350', and the switch 200 may be coupled to the heat sink 350', as depicted in FIG. 4. More specifically, the heat sinks 350, 350' may each have a plurality of fins 352, 352' that extend towards the respective switching devices 160, 260 and are thermally coupled to the respective switching devices 160, 260 so as to draw excess heat flux from the respective switching devices 160, 260. As such, if the current applied across the respective heating electrodes 182, 282 causes an increase in temperature that is in excess of the threshold, the respective heat sinks 350, 350' may draw the additional heat flux away from the respective switching devices 160, 260 to avoid a situation whereby the respective cores 162, 262 are unable to absorb all of the heat produced by the respective heating electrodes 182, 282. In some embodiments, the heat sinks 350, 350' may be used to selectively draw heat flux out of the phase change material of the switching devices 160, 260 to cause the phase change material to change phase and contract, as described herein. The heat sinks 350, 350' may further transfer the heat, as is generally understood. It should be understood that the heat sinks 350, 350' depicted in FIGS. 3 and 4 are merely illustrative heat sinks. Other heat exchangers may also be used without departing from the scope of the present disclosure. In addition to acting to draw heat flux, the heat sinks 350, 350' may further act as support structures for supporting the respective switching devices 160, 260 and positioned and/or configured such that the phase change material within the respective switching devices 160, 260 is directed towards an appropriate location, as described herein.

Figure 5:
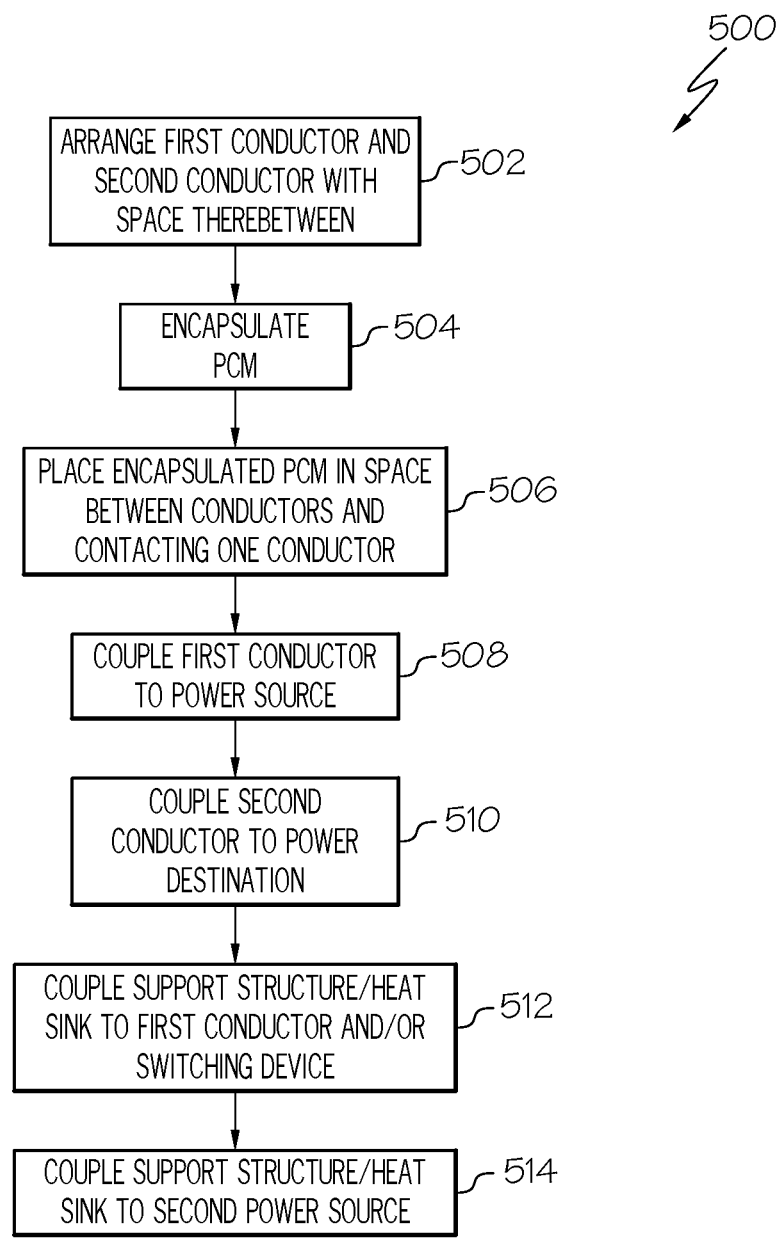
FIG. 5 depicts a flow diagram of an illustrative method of forming a switch incorporating a PCM switching mechanism according to one or more embodiments shown and described herein.

FIG. 5 depicts an illustrative method, generally designated 500, for forming a switch, such as, for example, the switch 100 depicted in FIGS. 1A-1B, according to some embodiments. Referring to FIGS. 1A, 1B, and 5, the first conductor 120 and the second conductor 130 may be arranged relative to one another such that a space exists therebetween at block 502. That is, the first conductor 120 and the second conductor 130 may be arranged such that they are spaced the distance d apart from one another. In some embodiments, the first conductor 120 and the second conductor 130 may be arranged on a substrate, such as a circuit board or the like. In some embodiments, the first conductor 120 and the second conductor 130 may be fixed to the substrate such that they are not movable relative to the substrate and/or one another.

At block 504, the phase change material that is used for the switching device 160 is encapsulated to achieve the core 162 surrounding the shell 164. That is, the material for the core 162 is selected based on certain properties to be achieved (e.g., amount of expansion during phase change, particular temperature at which phase change occurs, and/or the like) and is encapsulated by applying an encapsulant that becomes the shell 164. In some embodiments, encapsulating the core 162 may include applying an atomic layer deposition (ALD) process to the material used for the core 162. ALD is a thin-film deposition technique that involves applying a precursor to the material used for the core 162 such that a thin film forms on the material used for the core 162 until a sufficient amount of film entirely encapsulates the material used for the core 162 and forms the shell 164. The process for ALD, as well as the type of precursor materials that result in formation of the shell 164 around the core 162, should be generally understood and is therefore not described in greater detail herein. While ALD is specifically described herein, the present disclosure is not limited to such. That is, other methods of depositing the shell 164 on the core 162 or otherwise encapsulating the core 162 may also be used without departing from the scope of the present disclosure.

At block 506, the encapsulated phase change material (e.g., the switching device 160) is placed between the first conductor 120 and the second conductor 130. That is, the switching device 160 is coupled to the first conductor 120 such that the switching device 160 electrically contacts the first conductor 120. In addition, the electrical connection between the first conductor 120 and the switching device 160 allows for an electrical coupling to the second conductor 130 when the switching device 160 phase changes, as described herein.

To function as described herein, the assembly including the first conductor 120, the second conductor 130, and the switching device 160 with the encapsulated phase change material is coupled to the power source 140 and the power destination 170. That is, the first conductor 120 is electrically coupled to the power source 140 at block 508 and the second conductor 130 is electrically coupled to the power destination 170 at block 510. More particularly, the first conductor 120 is coupled to a terminal or the like of the power source 140 such that electrical power from the power source 140 is received by the first conductor 120. In addition, the second conductor 130 is coupled to a terminal or the like of the power destination 170 such that electrical power from the second conductor 130 flows to the power destination 170.

In embodiments including the support structure 150 or the heat sink 350 (FIG. 3), the support structure 150 or the heat sink 350 may be coupled to the switching device 160 at block 512. That is, the support structure 150 is arranged such that the support structure 150 provides a platform for the switching device 160 to ensure that, when the phase change material is heated and changes phase, the expansion of the phase change material is directed towards the second conductor 130 to cause an electrical connection of the first conductor 120 with the second conductor 130 via the electrically conductive shell 164. For example, as described herein, the support structure 150 may be arranged and configured to surround the switching device 160 on all but one side (e.g., having one open end that is open towards the second conductor 130). In addition, to ensure that the force of expansion of the phase change material does not push the support structure 150 out of position, the support structure 150 may be fixed in place. For example, the support structure 150 may be fixed to the same substrate (such as a circuit board or the like) that the various other components described herein (e.g., the first conductor 120, the second conductor 130, and the switching device 160) are coupled. In embodiments where the heat sink 350 (FIG. 3) are used, the heat sink 350 may also be coupled to the switching device 160 such that the fins 352 (or other heat flux absorbing structures) of the heat sink 350 are thermally coupled to the switching device 160. Similar to the support structure 150, the heat sink 350 may also be fixed, arranged, and configured such that the switching device 160 expands towards the second conductor 130 when the phase change material heats and undergoes phase change.

At block 514, the support structure 150 or the heat sink 350 may be coupled to the second power source 180 via the heating electrode 182 such that heat flux generated by the heating electrode 182 is directed toward the switching device 160 to heat the switching device, as described herein.

Figure 6:
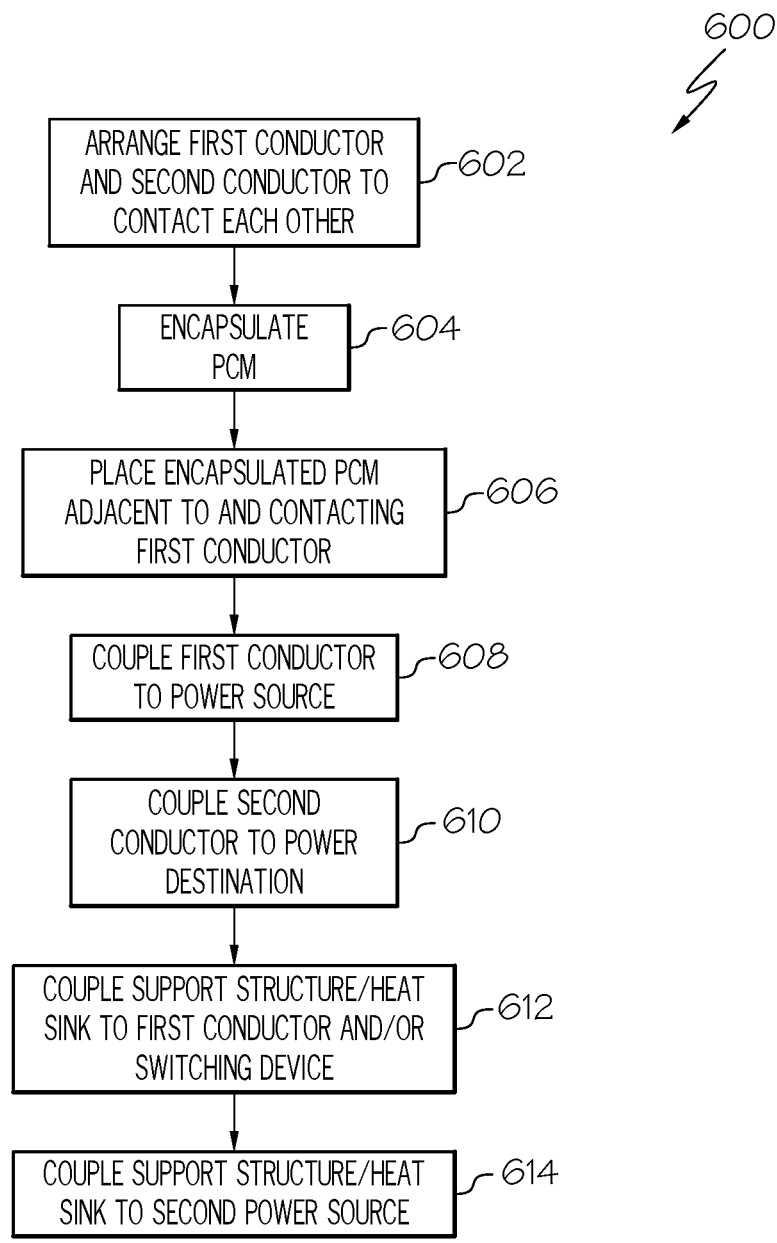
FIG. 6 depicts a flow diagram of an illustrative method of forming a breaker incorporating a PCM switching mechanism according to one or more embodiments shown and described herein.

FIG. 6 depicts an illustrative method, generally designated 600, for forming a breaker, such as, for example, the breaker depicted in FIGS. 2A-2B, according to some embodiments. Referring to FIGS. 2A, 2B, and 6, the first conductor 220 and the second conductor 230 may be arranged relative to one another such that they contact one another at block 602. That is, the first conductor 220 and the second conductor 230 may be arranged such that the first conductor 220 contacts the second conductor 230 in an initial state, but is movable out of contact with the second conductor 230, as described herein. In some embodiments, the first conductor 220 and the second conductor 230 may be arranged on a substrate, such as a circuit board or the like. The second conductor 230 may be fixed to the substrate such that it does not move, but the first conductor 220 may be coupled in such a manner that the first conductor 220 is movable out of contact with the second conductor 230, as described herein.

At block 604, the phase change material that is used for the switching device 260 is encapsulated to achieve the core 262 surrounding the shell 264. That is, the material for the core 262 is selected based on certain properties to be achieved (e.g., amount of expansion during phase change, particular temperature at which phase change occurs, and/or the like) and is encapsulated by applying an encapsulant that becomes the shell 264. In some embodiments, encapsulating the core 262 may include applying an atomic layer deposition (ALD) process to the material used for the core 262. ALD is a thin-film deposition technique that involves applying a precursor to the material used for the core 262 such that a thin film forms on the material used for the core 262 until a sufficient amount of film entirely encapsulates the material used for the core 262 and forms the shell 264. The process for ALD, as well as the type of precursor materials that result in formation of the shell 264 around the core 262, should be generally understood and is therefore not described in greater detail herein. While ALD is specifically described herein, the present disclosure is not limited to such. That is, other methods of depositing the shell 264 on the core 262 or otherwise encapsulating the core 262 may also be used without departing from the scope of the present disclosure.

At block 606, the encapsulated phase change material (e.g., the switching device 260) is placed adjacent to the first conductor 220. That is, the switching device 260 is coupled to the first conductor 220 such that the switching device 260 contacts the first conductor 220. As such, heat flux from the first conductor 220 is receivable by the switching device 260, as described herein. In addition, the switching device 260 may be particularly arranged such that, when the phase change material undergoes phase change and expands, the switching device 260 moves the first conductor 220 out of contact with the second conductor 230. The switching device 260 may also be particularly arranged such that, when phase change material undergoes phase change and expands, the switching device 260 does not contact the second conductor 230 to avoid a situation whereby the shell 264 of the switching device 260 electrically couples the first conductor 220 to the second conductor 230.

To function as described herein, the assembly including the first conductor 220, the second conductor 230, and the switching device 260 with the encapsulated phase change material is coupled to the power source 240 and the power destination 270. That is, the first conductor 220 is electrically coupled to the power source 240 at block 608 and the second conductor 230 is electrically coupled to the power destination 270 at block 610. More particularly, the first conductor 220 is coupled to a terminal or the like of the power source 240 such that electrical power from the power source 240 is received by the first conductor 220. In addition, the second conductor 230 is coupled to a terminal or the like of the power destination 270 such that electrical power from the second conductor 230 flows to the power destination 270.

In embodiments including the support structure 250 or the heat sink 350' (FIG. 4), the support structure 250 or the heat sink 350' may be coupled to the switching device 260 at block 612. That is, the support structure 250 is arranged such that the support structure 250 provides a platform for the switching device 260 to ensure that, when the phase change material is heated and changes phase, the expansion of the phase change material is directed in such a manner to move the first conductor 220 to break an electrical connection between the first conductor 220 with the second conductor 230. For example, as described herein, the support structure 250 may be arranged and configured to surround the switching device 260 on all but one side (e.g., having one open end that is open). In addition, to ensure that the force of expansion of the phase change material does not push the support structure 250 out of position, the support structure 250 may be fixed in place. For example, the support structure 250 may be fixed to the same substrate (such as a circuit board or the like) that the various other components described herein (e.g., the first conductor 220, the second conductor 230, and the switching device 260) are coupled. In embodiments where the heat sink 350' (FIG. 4) are used, the heat sink 350' may also be coupled to the switching device 260 such that the fins 352' (or other heat flux absorbing structures) of the heat sink 350' are thermally coupled to the switching device 260. Similar to the support structure 250, the heat sink 350' may also be fixed, arranged, and configured such that the switching device 260 expands to move the first conductor 220 without contacting the second conductor 230 when the phase change material heats and undergoes phase change.

In some embodiments, at block 614, the support structure 250 or the heat sink 350' may be coupled to the second power source 280 via the heating electrode 282 such that heat flux generated by the heating electrode 282 is directed toward the switching device 260 to heat the switching device, as described herein.

It should now be understood that the present disclosure relates to switches (including breakers) that use a phase change material as a switching mechanism. In some embodiments, the PCM is coated or encapsulated with a conductive barrier layer that is coupled to one or more electrodes. The PCM absorbs heat and expands to make or break an electrical connection (e.g., switch in one direction) and contracts when it cools to reverse the switch (e.g., switch in another direction).

While particular embodiments have been illustrated and described herein, it should be understood that various other changes and modifications may be made without departing from the spirit and scope of the claimed subject matter.

Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A switch comprising:
   a first conductor;
   a second conductor spaced a distance from the first conductor such that the second conductor does not contact the first conductor; and
   a switching device electrically coupled to the first conductor, the switching device comprising a phase change material that, when heated, expands to electrically contact the second conductor.

2. The switch of claim 1, wherein a power source is electrically coupled to the first conductor, the power source providing a current across the first conductor.

3. The switch of claim 2, wherein a second power source coupled to a heating electrode arranged adjacent to the switching device such that resistive properties of the heating electrode cause heat to be produced from a current produced by the second power source, the heat being absorbed by the phase change material of the switching device.

4. The switch of claim 3, wherein a support structure is coupled to the switching device, the support structure providing a supporting structure that holds the heating electrode and directs expansion of the phase change material.

5. The switch of claim 1, wherein a power destination is electrically coupled to the second conductor.

6. The switch of claim 1, wherein a heat sink is thermally coupled to the switching device, the heat sink receiving heat flux from the switching device.

7. The switch of claim 1, wherein the switching device comprises a core having the phase change material and a shell encapsulating the core, the shell comprising an electrically conductive material.

8. The switch of claim 7, wherein the electrically conductive material is one or more of platinum, aluminum, copper, and silicon.

9. The switch of claim 7, wherein the shell has a thickness from about 1 nanometers (nm) to about 1000 nm.

10. The switch of claim 1, wherein the phase change material is selected from at least one of tin and indium.

11. A breaker comprising:
    a first conductor;
    a second conductor contacting the first conductor; and
    a switching device electrically coupled to the first conductor, the switching device comprising a phase change material that, when heated, expands to move the first conductor out of contact with the second conductor.

12. The breaker of claim 11, wherein a power source is electrically coupled to the first conductor, the power source providing a current across the first conductor.

13. The breaker of claim 12, further comprising a heating electrode positioned adjacent to the switching device, wherein the heating electrode causes heat to be produced, the heat being absorbed by the phase change material of the switching device.

14. The breaker of claim 11, wherein a power destination is electrically coupled to the second conductor.

15. The breaker of claim 11, wherein a support structure is coupled to the switching device, the support structure providing a supporting structure that directs expansion of the phase change material.

16. The breaker of claim 11, wherein a heat sink is thermally coupled to the switching device, the heat sink receiving heat flux from the switching device.

17. The breaker of claim 11, wherein the switching device comprises a core having the phase change material and a shell encapsulating the core, the shell comprising an electrically conductive material.

18. An electrical device comprising:
- a switch comprising:
  - a first conductor,
  - a second conductor spaced a distance from the first conductor such that the second conductor does not contact the first conductor, and
  - a switching device electrically coupled to the first conductor, the switching device comprising a phase change material that, when heated, expands to electrically contact the second conductor;
- a power source electrically coupled to the first conductor, the power source configured to provide a current across the first conductor, wherein resistive properties of the first conductor produce heat that is absorbed by the phase change material; and
- a power destination electrically coupled to the second conductor.

19. The electrical device of claim 18, wherein the switching device comprises a core having the phase change material and a shell encapsulating the core, the shell comprising an electrically conductive material.

20. The electrical device of claim 18, further comprising a support structure comprising a heating electrode, the support structure coupled to the switching device, the support structure providing a supporting structure that directs expansion of the phase change material and the heating electrode providing heat to heat the switching device.

* * * * *